US008558585B2

(12) United States Patent
Ishimatsu

(10) Patent No.: US 8,558,585 B2
(45) Date of Patent: Oct. 15, 2013

(54) SIGNAL TRANSMISSION CIRCUIT AND SWITCH DRIVING DEVICE USING THE SAME

(75) Inventor: Yuji Ishimatsu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/401,915

(22) Filed: Feb. 22, 2012

(65) Prior Publication Data

US 2012/0212270 A1    Aug. 23, 2012

(30) Foreign Application Priority Data

Feb. 22, 2011  (JP) .................................. 2011-035997

(51) Int. Cl.
*H03K 3/00* (2006.01)
(52) U.S. Cl.
USPC ......................................................... 327/108
(58) Field of Classification Search
USPC ................................................ 327/108, 112
See application file for complete search history.

(56) References Cited

U.S. PATENT DOCUMENTS 6,856,175 B2 *   2/2005   Wodnicki ....................... 327/108
7,233,178 B2 *   6/2007   Yu et al. ......................... 327/112

FOREIGN PATENT DOCUMENTS

JP       2002-314392      10/2002

* cited by examiner

*Primary Examiner* — Hai L Nguyen
(74) *Attorney, Agent, or Firm* — Fish & Richardson P.C.

(57) ABSTRACT

A signal transmission circuit is provided, which includes a level shifting circuit performing level shifting on an input signal and then outputting the input signal, but which can inhibit the output of an erroneous signal caused by the voltage change of the power source. The level shifting circuit, for individually performing level shifting on a first input signal and a second input signal, and outputting the first input signal and the second input signal as a first shifted signal and a second shifted signal respectively, comprises a first series circuit having a switching element switched according to the first input signal and a resistor, a second series circuit having a switching element switched according to the second input signal and a resistor, and a counter-current preventing portion for preventing a reverse current from flowing from the ground terminal toward the first series circuit and the second series circuit.

21 Claims, 12 Drawing Sheets

SIGNAL TRANSMISSION CIRCUIT AND SWITCH DRIVING DEVICE USING THE SAME

BACKGROUND OF THE INVENTION

1. Field of the Invention

The present invention relates to a signal transmission circuit and a switch driving device using the same.

2. Description of the Related Art

Conventionally, a signal transmission circuit for transmitting a signal to a back-end side circuit is used in various devices. As an example of the signal transmission circuit, a signal transmission circuit disposed with a level shifting circuit shown in FIG. 15 can be provided.

The signal transmission circuit shown in FIG. 15 is briefly illustrated below. The signal transmission circuit performs level shifting on a pulse signal output from a pulse generator 85 by use of a level shifting circuit 84, and transmits the pulse signal to an RS flip-flop circuit 82.

More specifically, the pulse generator 85 outputs an on signal $S_{ON}$ and an off signal $S_{OFF}$ used as pulse signals to a transistor 181 and a transistor 182 respectively. Furthermore, these pulse signals are generated in such a manner that pulses are superposed non-periodically. Moreover, the level shifting circuit 84 is disposed between a power source side (voltage VB) and a ground terminal GND and comprises a series circuit having the transistor 181 and a resistor 183, and a series circuit having the transistor 182 and a resistor 184, and the series circuits are connected in parallel.

In the level shifting circuit 84, the current flowing into the resistor 183 is changed corresponding to the on and the off of the transistor 181, and the current flowing into the resistor 184 is changed corresponding to the on and the off of the transistor 182. The level shifting circuit 84 uses the voltage between the resistor 183 and the transistor 181 as an on signal $S_{ON}$, performs level shifting on the on signal $S_{ON}$ to generate a set signal $S_{SET}$, and outputs the set signal $S_{SET}$ to a reset terminal of the RS flip-flop circuit 82. Moreover, the level shifting circuit 84 uses the voltage between the resistor 184 and the transistor 182 as an off signal $S_{OFF}$, performs level shifting on the off signal $S_{OFF}$ to generate a reset signal $S_{RESET}$, and outputs the reset signal $S_{RESET}$ to the reset terminal of the RS flip-flop circuit 82.

Furthermore, the RS flip-flop circuit 82 generates an output signal corresponding to the set signal $S_{SET}$ and the reset signal $S_{RESET}$, and then outputs the output signal to the back-end circuit. The output signal is used for controlling operation of the device.

PRIOR ART DOCUMENT

Patent Document 1: Japanese Patent Publication No. 2002-314392

SUMMARY OF THE INVENTION

According to the signal transmission circuit, level shifting can be performed on the on signal $S_{ON}$ and the off signal $S_{OFF}$, so as to obtain the set signal $S_{SET}$ and the reset signal $S_{RESET}$. However, if an erroneous signal of the set signal $S_{SET}$ or the reset signal $S_{RESET}$ is generated due to change of the voltage VB of the power source, an erroneous operation may result.

For example, when the voltage VB returns from negative to positive, it is possible that a recovery current caused by a parasitic diode of each of the transistors (181, 182) flows into each of the resistors (183, 184), and causes decrease of the voltage and generation of an erroneous signal. Moreover, when high voltage change exists in the transient dVB/dt, it is possible that a current flows into a parasitic capacitance of each of the transistors (181, 182), and causes decrease of the voltage and generation of an erroneous signal.

In view of these problems, the present invention is developed with the aim of providing a signal transmission circuit which has a level shifting circuit performing level shifting on an input signal and then outputting the input signal, but can inhibit the output of an erroneous signal caused by the voltage change of the power source, and a switch driving device using the same.

To achieve the objectives, the signal transmission circuit of the present invention includes a level shifting circuit for individually performing level shifting on a first input signal and a second input signal, and outputting the first input signal and the second input signal as a first shifted signal and a second shifted signal, respectively, in which it is structured such that the level shifting circuit is disposed between a power source and a ground terminal and comprises a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and a voltage on the first series circuit is used as the first shifted signal, a voltage on the second series circuit is used as the second shifted signal, and the first shifted signal and the second shifted signal are separately output, and the level shifting circuit includes a counter-current preventing portion for preventing a reverse current from flowing from the ground terminal toward the first series circuit and the second series circuit (a first structure).

According to this structure, the output of an erroneous signal caused by a reverse current flowing from the ground terminal toward the first series circuit and the second series circuit can be inhibited.

Preferably, the first structure can be constructed such that the counter-current preventing portion is a diode disposed between the first series circuit and second series circuit and the ground terminal (a second structure).

Moreover, the second structure can also include: an RS flip-flop to circuit to which the first shifted signal and the second shifted signal used as a set signal and a reset signal respectively are input (a third structure).

Moreover, the signal transmission circuit in other aspects of the present invention includes a level shifting circuit, for performing level shifting on pulse signals of both a first input signal and a second input signal, in which the pulse signals are separately used as a first shifted signal and a second shifted signal; and a filtering circuit, for implementing filtering processing on the first shifted signal and the second shifted signal, wherein the level shifting circuit is disposed between a power source and a ground terminal and comprises a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and a voltage on the first series circuit is used as the first shifted signal, a voltage on the second series circuit is used as the second shifted signal, the filtering circuit implements pulse termination delay processing on the first shifted signal, to generate a mask signal corresponding to the second shifted signal, and implements pulse termination delay processing on the second shifted signal, to generate a mask signal corresponding to the first shifted signal. During a pulse of the mask signal filtering processing is performed by proceeding pulse elimination processing on the first shifted signal and the second shifted signal (a fourth structure).

According to this structure, filtering processing can be used to eliminate an erroneous pulse, so as to inhibit the output of an erroneous signal. Moreover, the filtering processing can be performed more reasonably by executing the pulse termination delay processing.

Moreover, the signal transmission circuit in other aspects of the present invention includes a level shifting circuit, for performing level shifting on pulse signals of both a first input signal and a second input signal, in which the pulse signals are separately used as a first shifted signal and a second shifted signal; and a filtering circuit, for implementing filtering processing on the first shifted signal and the second shifted signal, wherein the level shifting circuit is disposed between a power source and a ground terminal and comprises a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and a voltage on the first series circuit is used as the first shifted signal, a voltage on the second series circuit is used as the second shifted signal, the filtering circuit generates a mask signal corresponding to the second shifted signal based on the first shifted signal, and generates a mask signal corresponding to the first shifted signal based on the second shifted signal, and after pulse onset delay processing is implemented on the first shifted signal and the second shifted signal. During a pulse of the mask signal, filtering processing is performed by proceeding pulse elimination processing on the first shifted signal and the second shifted signal (a fifth structure).

According to this structure, filtering processing can be used to eliminate an erroneous pulse, so as to inhibit the output of an erroneous signal. Moreover, the filtering processing can be performed more reasonably by executing the pulse onset delay processing.

Moreover, the first structure can be constructed such that the filtering circuit generates the mask signal corresponding to the second shifted signal by implementing pulse termination delay processing on the first shifted signal, and generates the mask signal corresponding to the first shifted signal by implementing pulse termination delay processing on the second shifted signal (a sixth structure).

Moreover any one of the fourth to the sixth structures can include: an RS flip-flop circuit to which the first shifted signal and the second shifted signal used as a set signal and a reset signal respectively are input (a seventh structure), wherein the filtering processing is implemented on the first shifted signal and the second shifted signal.

Moreover, the switch driving device of the present invention includes the signal transmission circuit of the third or the seventh structure, and a driver, for generating an output signal corresponding to an output of the RS flip-flop circuit, and supplying the output signal to a switch (an eighth structure).

Preferably, the eighth structure can be constructed such that the switch is driven and a current of a motor is controlled (a ninth structure). Alternatively, it can also be constructed such that the switch is driven and a desired output voltage is generated from an input voltage (a tenth structure).

Effect of the Invention

The signal transmission circuit according to the present invention has a level shifting circuit performing level shifting on an input signal and then outputting the input signal, but can inhibit the output of an erroneous signal caused by the voltage change of the power source. Moreover, the switch driving device according to the present invention can obtain advantages of the signal transmission circuit of the present utility model.

Other features and advantages of the present invention will become more apparent from the detailed descriptions given below with reference to the accompanying drawings.

DETAILED DESCRIPTION OF THE INVENTION

Below, a first embodiment and a second embodiment are provided to illustrate embodiments of the present invention.

1. First Embodiment

<Overall Structure>

Figure 1:
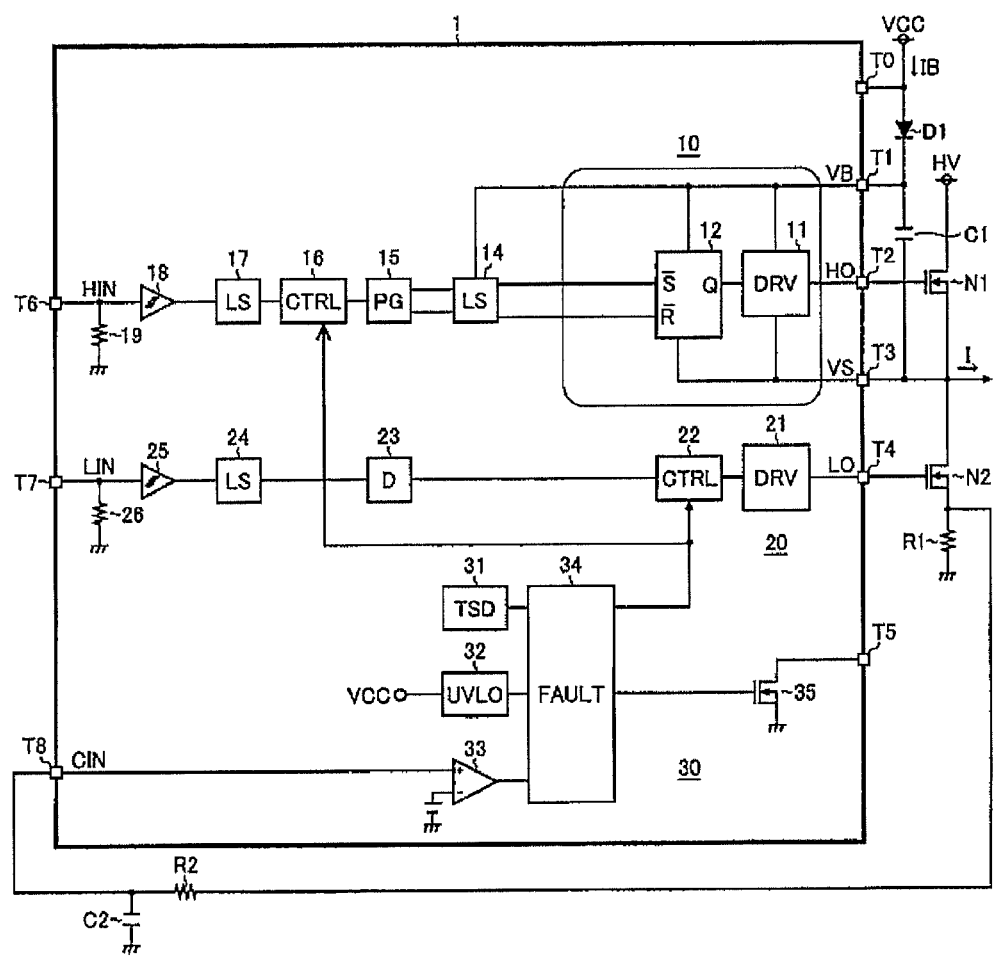
FIG. 1 is a block diagram of a switch driving device according to a first embodiment of the present invention.

FIG. 1 is a block diagram denoting the overall structure of a switch driving device according to a first embodiment. A switch driving device 1 of this structure is a one-piece semiconductor integrated circuit device including an upper side switch driving portion 10, a lower side switch driving portion 20, and a fault safeguard portion 30. The switch driving device 1 performs on/off control on N-channel metal oxide semiconductor (MOS) field effect transistors N1 and N2 connected to the outside, to control a driving current I of a load (not shown in the drawings).

The switch driving device 1 includes external terminals T0 to T8, so as to achieve external electrical connection of the device. The switch driving device 1 is not only externally connected with the transistors N1 and N2 used as on/off control objects, but also externally connected with resistors R1 and R2, capacitors C1 and C2, and a diode D1.

At the outside of the switch driving device 1, a drain of the transistor N1 is connected to an applying end of a high voltage HV (hundreds of volts). A source and a back-gate of the transistor N1 are connected to the external terminal T3 (switch terminal). A gate of the transistor N1 is connected to the external terminal T2 (upper side gate terminal). A drain of the transistor N2 is connected to the external terminal T3. A source and a back-gate of the transistor N2 are connected to a ground terminal through the resistor R1, and in another aspect, are also connected to a first end of the resistor R2. A second end of the resistor R2 is connected to the external terminal T8 (limit detection terminal), and in another aspect, is also connected to the ground terminal through the capacitor C2. A gate of the transistor N2 is connected to the external terminal T4 (lower side gate terminal). A first end of the capacitor C1 is connected to the external terminal T1 (boost terminal). A second end of the capacitor C1 is connected to the external terminal T3. An anode of the diode D1 is connected to an applying end of a power source voltage VCC, and in another aspect, is also connected to the external terminal T0 (power source terminal). A cathode of the diode D1 is connected to the external terminal T1.

The upper side switch driving portion 10 includes a driver 11, an RS flip-flop circuit 12, a level shifting circuit 14, a pulse generator 15, a controller 16, a level shifter 17, a Schmitt trigger 18, and a resistor 19.

The driver 11 outputs an upper side output signal HO to the external terminal T2 based on an output signal of the RS flip-flop circuit 12. Furthermore, the high level of the upper side output signal HO becomes a boost voltage VB, and the low level thereof becomes a switch voltage VS.

The RS flip-flop circuit 12 includes a set terminal (S terminal) to which a set signal $S_{SET}$ is input, a reset terminal (R terminal) to which a reset signal $S_{RESET}$ is input, and an output terminal (Q terminal) for outputting an output signal $S_Q$. The RS flip-flop circuit 12 uses the falling edge of the set signal $S_{SET}$ as a trigger to set the output signal $S_Q$ to a high level; and uses the falling edge of the reset signal $S_{RESET}$ as a trigger to reset the output signal $S_Q$ to a low level.

Figure 2:
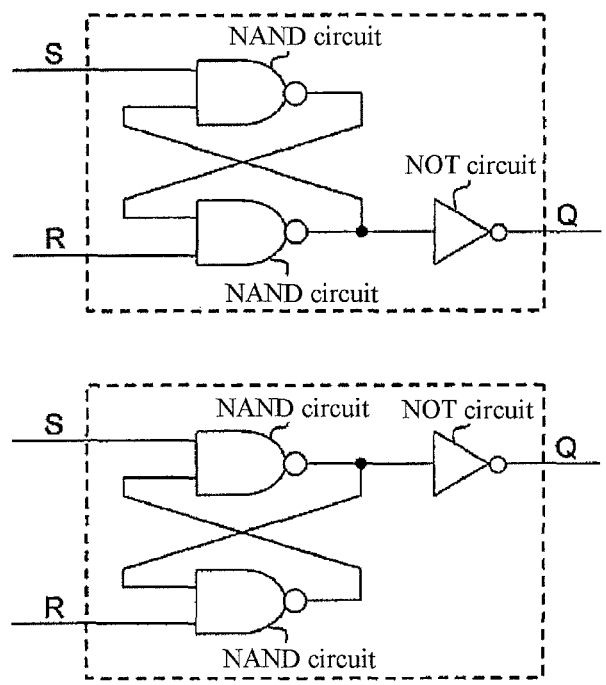
FIG. 2 is a more detailed structural diagram of an RS flip-flop circuit.

Furthermore, both the set signal $S_{SET}$ and the reset signal $S_{RESET}$ can be input from the level shifting circuit 14. Moreover, as far as the manner of the RS flip-flop circuit 12 is concerned, it can not only be of a reset preferred type as shown in the first half segment of FIG. 2, but also can be of a set preferred type as shown in the second half segment of FIG. 2.

Furthermore, the driver 11 and the RS flip-flop circuit 12 belong to a high potential frame (referring to an arc square frame in FIG. 1) operating between the boost voltage VB applied to the external terminal T1 and the switch voltage VS applied to the external terminal T3, and the rest circuit frames all belong to a low potential frame.

The level shifting circuit 14 is a circuit for performing level shifting on a signal and then transmitting the signal from the low potential frame to the high potential frame. More specifically, each of the pulse signals of an on signal $S_{ON}$ and an off signal $S_{OFF}$ is input to the level shifting circuit 14 from the pulse generator 15 belonging to the low potential frame. Moreover, the level shifting circuit 14 separately performs level shifting on these signals, and then outputs the signals to the RS flip-flop circuit 12. The detailed structure of the level shifting circuit 14 is illustrated again.

The pulse generator 15 generates each of the pulse signals of the on signal $S_{ON}$ (a gate signal of the following transistor 141) and the off signal $S_{OFF}$ (a gate signal of the following transistor 142) based on the output signal of the controller 16. More specifically, the pulse generator 15 uses the rising edge of the output signal of the controller 16 as a trigger, so that the on signal $S_{ON}$ becomes a high level only for a specific on duration $T_{ON1}$, and uses the falling edge of the output signal of the controller 16 as a trigger, so that the off signal $S_{OFF}$ becomes a high level only for a specific on duration $T_{ON2}$.

Furthermore, during the on duration $T_{ON1}$ and the on duration $T_{ON2}$, the output signal (a signal corresponding to an upper side input signal HIN) of the controller 16 must be set such that the on signal $S_{ON}$ and the off signal $S_{OFF}$ do not become a high level simultaneously. That is, when the switch driving device 1 normally operates, if at least one of the on signal $S_{ON}$ and the off signal $S_{OFF}$ is at a high level, the other becomes a low level.

The controller 16 controls whether an output signal of the level shifter 17 is transmitted to the pulse generator 15 (and further whether the transistor N1 can be driven) based on a fault signal input from a fault signal generating circuit 34.

The level shifter 17 performs level shifting on an output signal of the Schmitt trigger 18 to obtain a voltage level (VCC-GND) suitable for being input to the controller 16 and then outputs the voltage level (VCC-GND).

The Schmitt trigger 18 transmits the upper side input signal HIN input to the external terminal T6 to the level shifter 17. Furthermore, a threshold voltage of the Schmitt trigger 18 is endowed with specific lag. Tolerance to noise can be enhanced through such a structure.

The resistor 19 pulls the external terminal T6 downward into the ground terminal. Therefore, in a case where the external terminal T6 is in an open state, the upper side input signal HIN becomes a low level (a logic level used for switching off the transistor N1), so the transistor N1 will not be unintentionally switched on.

The lower side switch driving portion 20 includes a driver 21, a controller 22, a delay portion 23, a level shifter 24, a Schmitt trigger 25, and a resistor 26.

The driver 21 outputs a lower side output signal LO to the external terminal T4 based on an output signal of the controller 22. Furthermore, the high level of the lower side output signal LO becomes the power source voltage VCC, and the low level thereof becomes a ground voltage GND.

The controller 22 controls whether an output signal of the delay portion 23 is transmitted to the driver 21 (and further whether the transistor N2 can be driven) based on a fault signal input from the fault signal generating circuit 34.

The delay portion 23 endows an output signal of the level shifter 24 with a specific delay (equivalent to the circuit delay generated in the pulse generator 15, the level shifting circuit 14, and the RS flip-flop circuit 12 of the upper side switch driving portion 10) and transmits the output signal to the controller 22.

The level shifter 24 performs level shifting on an output signal of the Schmitt trigger 25 to obtain a voltage level (VCC-GND) suitable for being input to the controller 22 and then outputs the voltage level (VCC-GND).

The Schmitt trigger 25 transmits a lower side input signal LIN input to the external terminal T7 to the level shifter 24. Furthermore, a threshold voltage of the Schmitt trigger 25 is endowed with specific lag. The tolerance to noise can be increased through such a structure.

The resistor 26 pulls the external terminal T7 downward into the ground terminal. Therefore, in a case where the external terminal T7 is in an open state, the lower side input signal LIN becomes a low level (a logic level used for switching off the transistor N2), so the transistor N2 will not be unintentionally switched on.

The fault safeguard portion 30 has a temperature protection circuit (Thermal Shut Down (TSD) circuit) 31, a buck safeguard circuit (UVLO circuit for VCC monitoring) 32, a limit safeguard circuit 33, a fault signal generating circuit 34, and an N-channel MOS field effect transistor 35.

When the junction temperature of the switch driving device 1 rises to a specific threshold temperature, the temperature protection circuit 31 switches a normal logic level (such as low level) of a temperature protection signal to a fault logic level (such as high level).

When the power source voltage VCC decreases to a specific threshold voltage, the buck safeguard circuit 32 switches a normal logic level (such as low level) of a buck safeguard signal to a fault logic level (such as high level).

When a limit detection voltage CIN (equivalent to the switch voltage VS subjected to smoothing processing of the resistor R2 and the capacitor C2) input to the external terminal T8 rises to a specific threshold voltage, the limit safeguard circuit 33 switches a normal logic level (such as low level) of a limit safeguard signal to a fault logic level (such as high level). Furthermore, the so-called "limit" refers to a state in which the external terminal T3 is short-circuited at the applying end of the high voltage HV (or a high potential end with reference to this applying end).

The fault signal generating circuit 34 separately monitors the temperature protection signal input from the temperature protection circuit 31, the buck safeguard signal input from the buck safeguard circuit 32, and the limit safeguard signal input from the limit safeguard circuit 33, and in a case where a fault occurs in any one of the signals, the fault signal generating circuit 34 switches a normal logic level (such as low level) of a fault signal to a fault logic level (such as high level).

The transistor 35 forms an open drain output segment used for outputting an external fault signal from the external terminal T5. In a case where no fault occurs in the switch driving device 1, the transistor 35 is switched off by the fault signal generating circuit 34, so that the external fault signal becomes a high level. In another aspect, in a case where a certain fault is generated in the switch driving device 1, the transistor 35 is switched on by the fault signal generating circuit 34, so that the external fault signal becomes a low level.

<Bootstrap Circuit>

The switch driving device 1 includes a bootstrap circuit used as a mechanism for generating the boost voltage VB (a driving voltage of the high potential frame including the driver 11). The bootstrap circuit includes the diode D1 whose anode is connected to the applying end of the power source voltage VCC, and the capacitor C1 connected between the cathode of the diode D1 and the source of the transistor N1, and outputs the boost voltage VB from a connection node (the external terminal T1) of the diode D1 and the capacitor C1.

When the transistor N1 is switched off and the transistor N2 is switched on, so as to enable the switch voltage VS occurring in the external terminal T3 to become a low level (GND), the current IB flows through a path of the diode D1, the capacitor C1, and the transistor N2 from the applying end of the power source voltage VCC, thereby charging the capacitor C1 connected between the external terminal T1 and the external terminal T2. In this case, the boost voltage VB occurring in the external terminal T1 (that is, a charging voltage of the capacitor C1) becomes a voltage value obtained by subtracting a forward reduced voltage Vf of the diode D1 from the power source voltage VCC (=VCC−Vf).

In another aspect, if the capacitor C1 is charged, the transistor N1 is switched on, and the transistor N2 is switched off, so as to enable the switch voltage VS to rise from the low level (GND) to the high level (HV), the boost voltage VB rises until the boost voltage VB is equal to a voltage value which is higher than the high level (HV) of the switch voltage VS by the charging voltage (VCC−Vf) of the capacitor C1 (=HV+(VCC−Vf)). Therefore, the on/off control (especially the on control) can be performed on the N-channel MOS field effect transistor N1 by supplying the boost voltage VB used as the driving voltage of the high potential frame (the driver 11 and the RS flip-flop circuit 12) or the level shifting circuit 14.

<Driving and Operation of Upper Side Switch>

Figure 3:
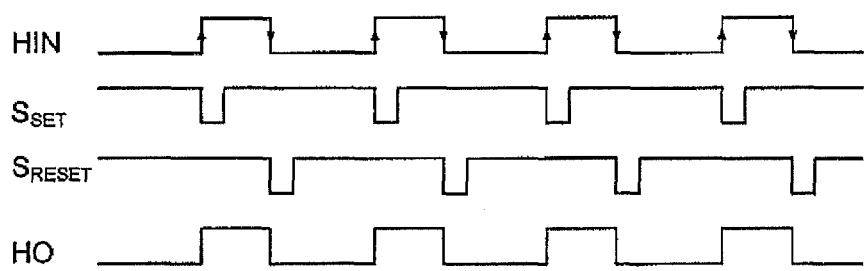
FIG. 3 is a relevant timing chart of driving and operation of an upper side switch.

FIG. 3 is a timing chart for illustrating driving and operation of an upper side switch; an upper side input signal HIN, a set signal $S_{SET}$, a reset signal $S_{RESET}$, and an upper side output signal HO are sequentially recorded from top to bottom. Furthermore, for brevity and convenience of illustration, the record of the change of the high level potential of the set signal $S_{SET}$ or the reset signal $S_{RESET}$ caused by the bootstrap operation is omitted in FIG. 3.

If the upper side input signal HIN rises from a low level to a high level, the rising edge is used as a trigger, so that the on signal $S_{ON}$ (the gate signal of the transistor 141) becomes a high level only for the on duration $T_{ON1}$. If the transistor 141 is switched on, so as to enable the set signal $S_{SET}$ to decrease from a high level to a low level, the falling edge is used as a trigger to set the upper side output signal HO to a high level.

In another aspect, if the upper side input signal HIN decreases from a high level to a low level, the falling edge is used as a trigger, so that the off signal $S_{OFF}$ (the gate signal of the transistor 142) becomes a high level only for the on duration $T_{ON2}$. If the transistor 142 is switched on, so as to enable the reset signal $S_{RESET}$ to decrease from a high level to a low level, the falling edge is used as a trigger to reset the upper side output signal HO to a low level.

By use of the operation, in the upper side switch driving portion 10, the upper side output signal HO is generated with the same logic level as that of the upper side input signal HIN, and the on/off control is performed on the transistor N1. Furthermore, the on duration of the transistors 141 and 142 can be shortened, so as to inhibit electric power consumption of the level shifting circuit 14.

<Detailed Structure of Level Shifting Circuit>

Secondly, the detailed structure of the level shifting circuit 14 is illustrated with reference to FIG. 4 used as the structural diagram of the circuit.

Figure 4:
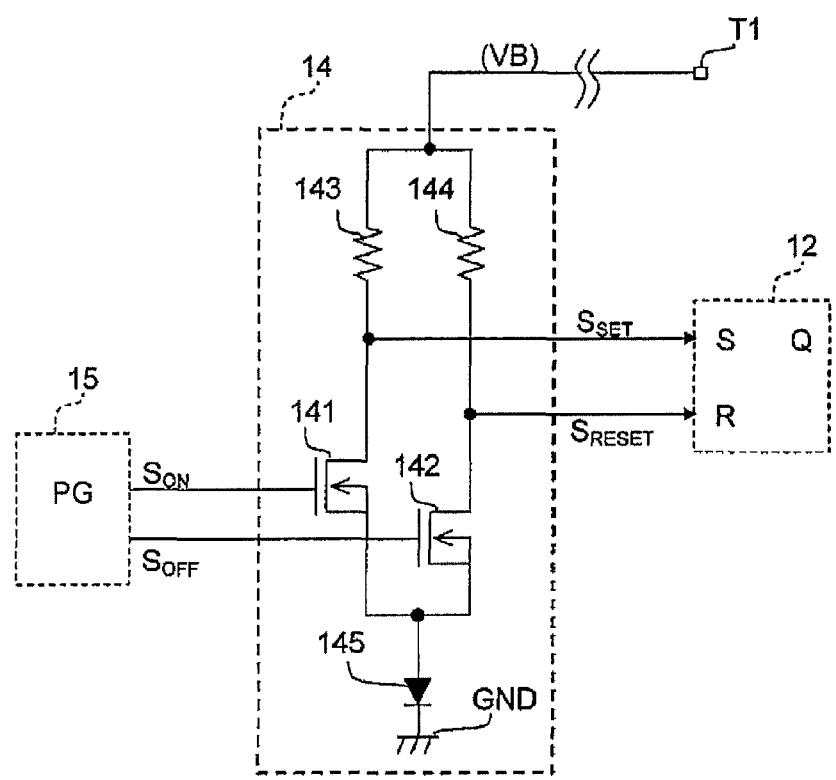
FIG. 4 is a structural diagram of a level shifting circuit according to the first embodiment.

As shown in FIG. 4, the level shifting circuit 14 includes N-channel Double-Diffused MOS (DMOS) field effect transistors (141, 142), resistors (143, 144), and a counter-current preventing diode 145.

A source and a back-gate of each of the transistors (141, 142) are both connected to the ground terminal GND through the counter-current preventing diode 145. A drain of the transistor 141 is connected to the set terminal of the RS flip-flop circuit 12, and in another aspect, is also connected to the external terminal T1 through the resistor 143. A drain of the transistor 142 is connected to the reset terminal of the RS flip-flop circuit 12, and in another aspect, is also connected to the external terminal T1 through the resistor 144. Furthermore, the transistors 141 and 142 are both designed with a high withstand voltage (such as 600V withstand voltage) relative to the transistors forming the low potential frame.

Moreover, the on signal $S_{ON}$ can be input to a gate of the transistor 141 from the pulse generator 15. Moreover, the off signal $S_{OFF}$ can be input to a gate of the transistor 142 from the pulse generator 15. Moreover, the anode side of the counter-current preventing diode 145 is connected to the source and the back-gate of each of the transistors (141, 142), and the cathode side thereof is connected to the ground terminal GND.

As described above, the level shifting circuit 14 is disposed between the external terminal T1 (which can be regarded as the power source of the voltage VB) and the ground terminal GND and comprises a first series circuit having the transistor 141 switched according to the on signal $S_{ON}$ and the resistor 143 connected to the transistor 141 in series, and a second series circuit having the transistor 142 switched according to the off signal $S_{OFF}$ and the resistor 144 connected to the transistor 142 in series, and the first series circuit and the second series circuit are connected in parallel.

Moreover, the level shifting circuit 14 uses a voltage of a side on the first series circuit closer to the ground terminal GND than the resistor 143 as an on signal $S_{ON}$, performs level shifting on the on signal $S_{ON}$ to generate a set signal $S_{SET}$ (shifted signal), and outputs the set signal $S_{SET}$ to the set terminal of the RS flip-flop circuit 12. Moreover, the level shifting circuit 14 uses a voltage of a side on the second series circuit closer to the ground terminal GND than the resistor 144 as an off signal $S_{OFF}$, performs level shifting on the off signal $S_{OFF}$ to generate a reset signal $S_{RESET}$ (shifted signal), and outputs the reset signal $S_{RESET}$ to the reset terminal of the RS flip-flop circuit 12.

Moreover, the counter-current preventing diode 145 plays a role of preventing a reverse current from flowing from the ground terminal GND toward the first series circuit and the second series circuit. Thereby, generation of an erroneous signal of the set signal $S_{SET}$ or the reset signal $S_{RESET}$ caused by the reverse current is avoided, and further, generation of an erroneous signal of the upper side output signal HO caused by the reverse current is avoided. For example, in a case where the voltage VB returns from negative to positive, the recovery current of a parasitic diode of each of the transistors (141, 142) can be prevented from flowing into each of the resistors (143, 144) and causing decrease of the voltage and generation an erroneous signal of the set signal $S_{SET}$ or the reset signal $S_{RESET}$.

2. Second Embodiment

A second embodiment is basically the same as the first embodiment except for such aspects as the structure of the level shifting circuit 14, and a filtering circuit 13 disposed between the level shifting circuit 14 and the RS flip-flop circuit 12. The following description focuses on the differences between the second embodiment and the first embodiment and omits description of the aspects in common.

Figure 5:
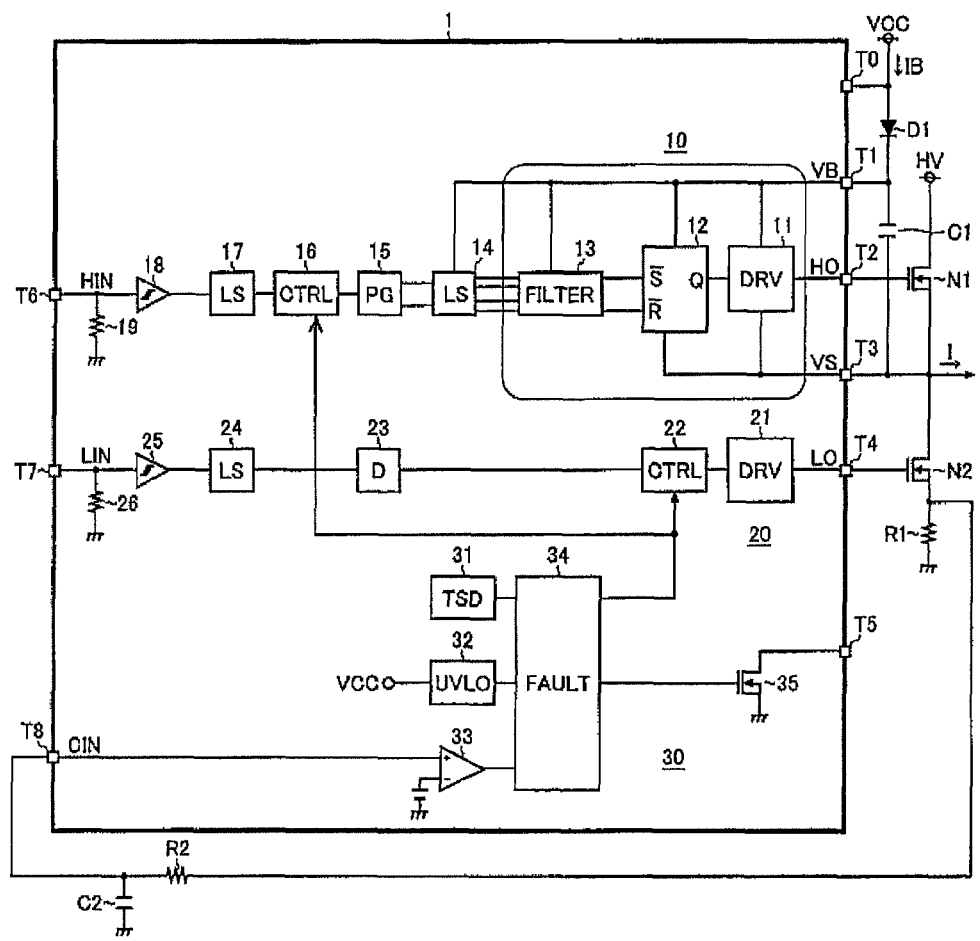
FIG. 5 is a block diagram of a switch driving device according to a second embodiment of the present invention.

FIG. 5 is a block diagram denoting the overall structure of a switch driving device according to the second embodiment. As shown in this drawing, a filtering circuit 13 is disposed between a level shifting circuit 14 and an RS flip-flop circuit 12.

The filtering circuit 13 is supplied with driving electric power from the terminal T1. Specific filtering processing is implemented on a signal input from the level shifting circuit 14, and the signal is output to a circuit of the RS flip-flop circuit 12. The detailed structure of the level shifting circuit 14 and the filtering circuit 13 is illustrated with reference to the structural diagrams presented in FIG. 6.

Figure 6:
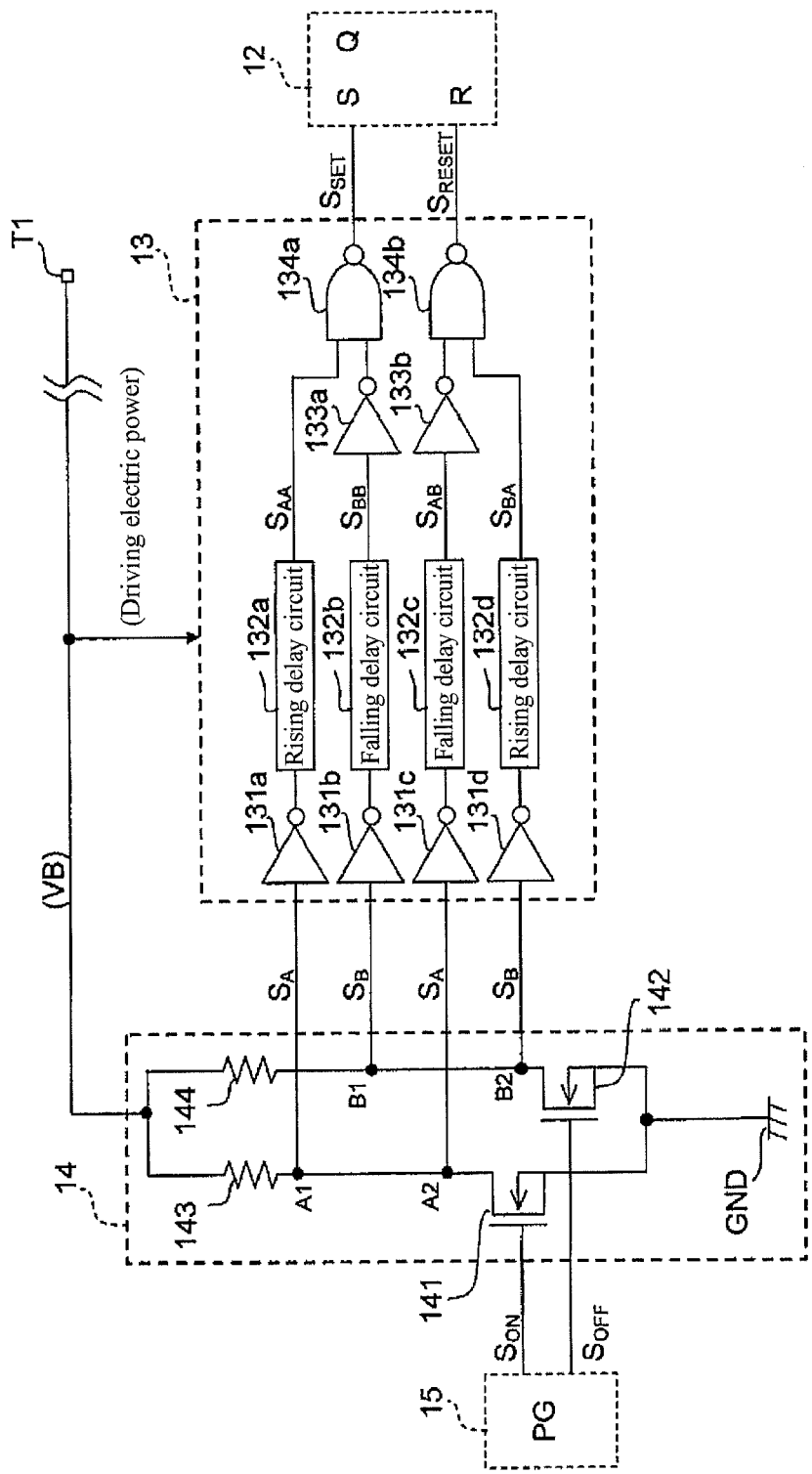
FIG. 6 is a structural diagram of a level shifting circuit and a filtering circuit according to the second embodiment.

First, the level shifting circuit 14 is illustrated. As shown in FIG. 6, the level shifting circuit 14 includes N-channel DMOS field effect transistors (141, 142), and resistors (143, 144).

A source and a back-gate of each of the transistors (141, 142) are both connected to the ground terminal GND. A drain of the transistor 141 is connected to two input terminals (a NOT circuit 131a and a NOT circuit 131c) of the filtering circuit 13, and in another aspect, is also connected to the external terminal T1 through the resistor 143. A drain of the transistor 142 is connected to two input terminals (a NOT circuit 131b and a NOT circuit 131d) of the filtering circuit 13, and in another aspect, is also connected to the external terminal T1 through the resistor 144. Furthermore, the transistors 141 and 142 are both designed with a high withstand voltage (such as 600V withstand voltage) relative to the transistors forming the low potential frame.

Moreover, the on signal $S_{ON}$ can be input to a gate of the transistor 141 from the pulse generator 15. Moreover, the off signal $S_{OFF}$ can be input to a gate of the transistor 142 from the pulse generator 15. Furthermore, in this embodiment, the counter-current preventing diode 145 disposed in the first embodiment is omitted. However, the counter-current preventing diode 145 can also be disposed in this embodiment.

Such a level shifting circuit 14 is disposed between the external terminal T1 (which can be regarded as the power source of the voltage VB) and the ground terminal GND and comprises a first series circuit having the transistor 141 switched according to the on signal $S_{ON}$ and the resistor 143 connected to the transistor 141 in series, and a second series circuit having the transistor 142 switched according to the off signal $S_{OFF}$ and the resistor 144 connected to the transistor 142 in series, and the first series circuit and the second series circuit are connected in parallel.

Moreover, the level shifting circuit 14 uses a voltage of a side (a point A1 and a point A2 shown in FIG. 6) on the first series circuit closer to the ground terminal GND than the resistor 143 as an on signal $S_{ON}$, performs level shifting on the on signal $S_{ON}$ to generate a signal $S_A$ (shifted signal), and outputs the signal $S_A$ to the filtering circuit 13 (the NOT circuit 131a and the NOT circuit 131c). Moreover, the level shifting circuit 14 uses a voltage of a side (a point B1 and a point B2 shown in FIG. 6) on the second series circuit closer than the resistor 144 as an off signal $S_{OFF}$, performs level shifting on the off signal $S_{OFF}$ to generate a signal $S_B$ (shifted signal), and outputs the signal $S_B$ to the filtering circuit 13 (the NOT circuit 131b and the NOT circuit 131d). Furthermore, the point A1 and the point A2 can be the same point, and the point B1 and the point B2 can also be the same point.

Next, the filtering circuit 13 is illustrated. As shown in FIG. 6, the filtering circuit 13 includes NOT circuits (131a to 131d, 133a, 133b), rising delay circuits (132a, 132d), falling delay circuits (132b, 132c), and NAND circuits (134a, 134b).

A signal $S_A$, a signal $S_B$, a signal $S_A$, and a signal $S_B$ can be input to the NOT circuits 131a, 131b, 131c, and 131d respectively from the level shifting circuit 14. Moreover, an output terminal of the NOT circuit 131a is connected to an input terminal of the NAND circuit 134a through the rising delay circuit 132a, and an output terminal of the NOT circuit 131b is connected to the other input terminal of the NAND circuit 134a through the falling delay circuit 132b and the NOT circuit 133a sequentially. Moreover, an output terminal of the NOT circuit 131c is connected to an input terminal of the NAND circuit 134b through the falling delay circuit 132c and the NOT circuit 133b sequentially, and an output terminal of the NOT circuit 131d is connected to the other input terminal of the NAND circuit 134b through the rising delay circuit 132d.

An output signal of the NAND circuit 134a can be used as the set signal $S_{SET}$ of the RS flip-flop circuit 12, and be output to the set terminal of the RS flip-flop circuit 12. Moreover, an output signal of the NAND circuit 134b can be used as the reset signal $S_{RESET}$ of the RS flip-flop circuit 12, and be output to the reset terminal of the RS flip-flop circuit 12.

Moreover, the rising delay circuit 132a implements rising delay processing to delay the rising timing by a preset time on a pulse signal input from the front-end side, and then outputs the pulse signal used as a signal $S_{AA}$ to the back-end side. The falling delay circuit 132b implements falling delay processing to delay the falling timing by a preset time on a pulse signal input from the front-end side, and then outputs the pulse signal used as a signal $S_{BB}$ to the back-end side. Furthermore, the signal $S_{AA}$ is used as a main signal of the set side of the RS flip-flop circuit 12, and the signal $S_{BB}$ is used as a mask signal of the set side (a signal masking an erroneous pulse).

Herein, the "rising delay processing" is an example of the processing of delaying an onset timing of each pulse for a pulse signal used as a processing object (pulse onset delay processing). By delaying the onset timing, the pulse width of the pulse is reduced accordingly. Moreover, the "falling delay processing" is an example of the processing to delay a termination timing of each pulse for a pulse signal used as a processing object (pulse termination delay processing). By delaying the termination timing, the pulse width of the pulse is increased accordingly.

Moreover, the falling delay circuit 132c implements falling delay processing to delay the falling timing by a preset time on a pulse signal input from the front-end side, and then outputs the pulse signal used as a signal $S_{AB}$ to the back-end side. The rising delay circuit 132d implements rising delay processing to delay the rising timing by a preset time on a pulse signal input from the front-end side, and then outputs the pulse signal used as a signal $S_{BA}$ to the back-end side. Furthermore, the signal $S_{BA}$ is used as a main signal of the reset side of the RS flip-flop circuit 12, and the signal $S_{AB}$ is used as a mask signal of the reset side.

The filtering circuit 13 according to the structure is used for filtering processing, to implement the processing of eliminating substantially periodically repeated pulses of the signal $S_A$ and the signal $S_B$ input from the level shifting circuit 14, which are regarded as erroneous pulses.

Figure 7:
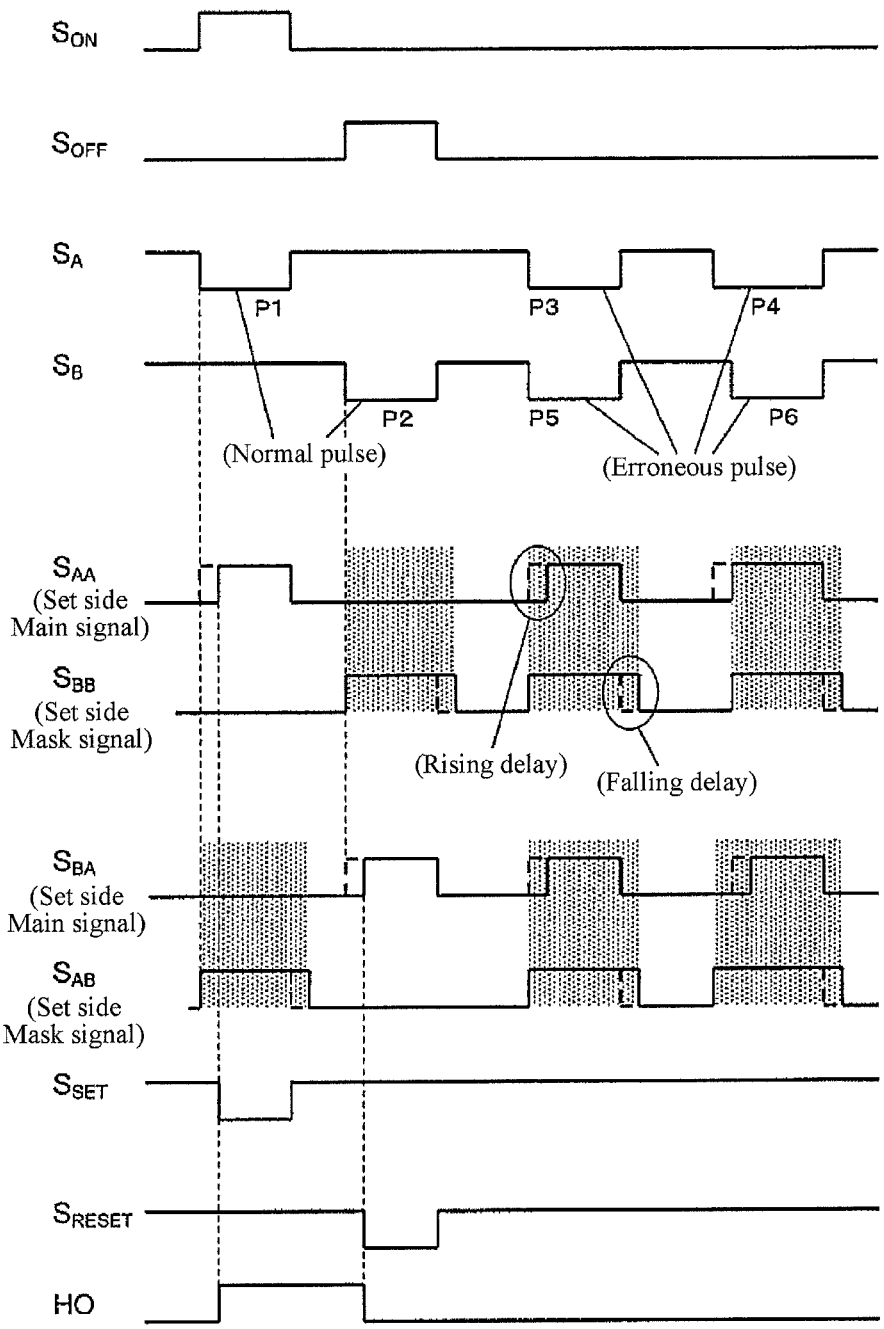
FIG. 7 is a timing chart for the filtering processing.

FIG. 7 is an example denoting a timing chart of each signal during the filtering processing. FIG. 7 illustrates a situation where in the signal $S_A$ and the signal $S_B$, correct pulses (normal pulses) P1 and P2 are generated corresponding to the on signal $S_{ON}$ and the off signal $S_{OFF}$ along with erroneous pulses P3 to P6 generated as described above.

As shown in FIG. 7, for the main signal $S_{AA}$ of the set side (a signal obtained after the rising delay processing is implemented on the signal $S_A$), the pulse is eliminated for the pulse duration (the duration denoted by the coloring in FIG. 7) of the mask signal $S_{BB}$ (a signal obtained after the falling delay processing is implemented on the signal $S_B$) of the set side. As a result, in the set signal $S_{SET}$, no pulse based on the erroneous pulses P3 and P4 will be generated. Moreover, for the main signal $S_{BA}$ of the reset side (a signal obtained after the rising delay processing is implemented on the signal $S_B$), the pulse is eliminated for the pulse duration (the duration denoted by the coloring in FIG. 7) of the mask signal $S_{AB}$ (a signal obtained after the falling delay processing is implemented on the signal $S_A$) of the reset side. As a result, in the reset signal $S_{RESET}$, no pulse based on the erroneous pulses P5 and P6 will be generated.

Such filtering processing of the filtering circuit 13 can eliminate generation of an erroneous signal of the upper side output signal HO caused by an erroneous pulse as described above. Moreover, the rising delay processing is implemented on the main signals (the signal $S_{AA}$ and the signal $S_{BA}$), and the falling delay processing is implemented on the mask signals (the signal $S_{BB}$ and the signal $S_{AB}$). Therefore, even if the duration of an erroneous pulse in the main signal departs from the pulse duration of the mask signal, as long as the extent of the departure is controlled within a margin obtained through delay processing (determined corresponding to the delay time), the erroneous pulse can be eliminated. Thereby, the filtering processing can be performed more reasonably (more actually).

Either or both of the rising delay processing and the falling delay processing can be omitted. The delay time in the rising delay processing or the falling delay processing is properly preset so as to prevent the correct pulse of the signal $S_A$ or the signal $S_B$ from being erroneously eliminated.

3. Others

<Generation Manner of Erroneous Signal>

As illustrated so far, the switch driving device 1 according to the first embodiment is disposed with the counter-current preventing diode 145 to prevent generation of an erroneous signal of the upper side output signal HO caused by the reverse current in the level shifting circuit 14. Moreover, the switch driving device 1 according to the second embodiment is disposed with the filtering circuit 13 to prevent generation of an erroneous signal of the upper side output signal HO caused by an erroneous pulse of the shifted signal.

Explanation is given herein and in connection with the exemplary timing charts shown in FIG. 8 to FIG. 11 of several examples of manners for generating an erroneous signal of the upper side output signal HO provided that the counter-current preventing diode 145 or the filtering circuit 13 is not disposed. These timing charts relate to a lower side input signal LIN, an upper side input signal HIN, a boost voltage VB, a switch voltage VS, a set signal $S_{SET}$, a reset signal $S_{RESET}$, an output signal $S_Q$ of the RS flip-flop circuit 12, and an upper side output signal HO.

Figure 8:
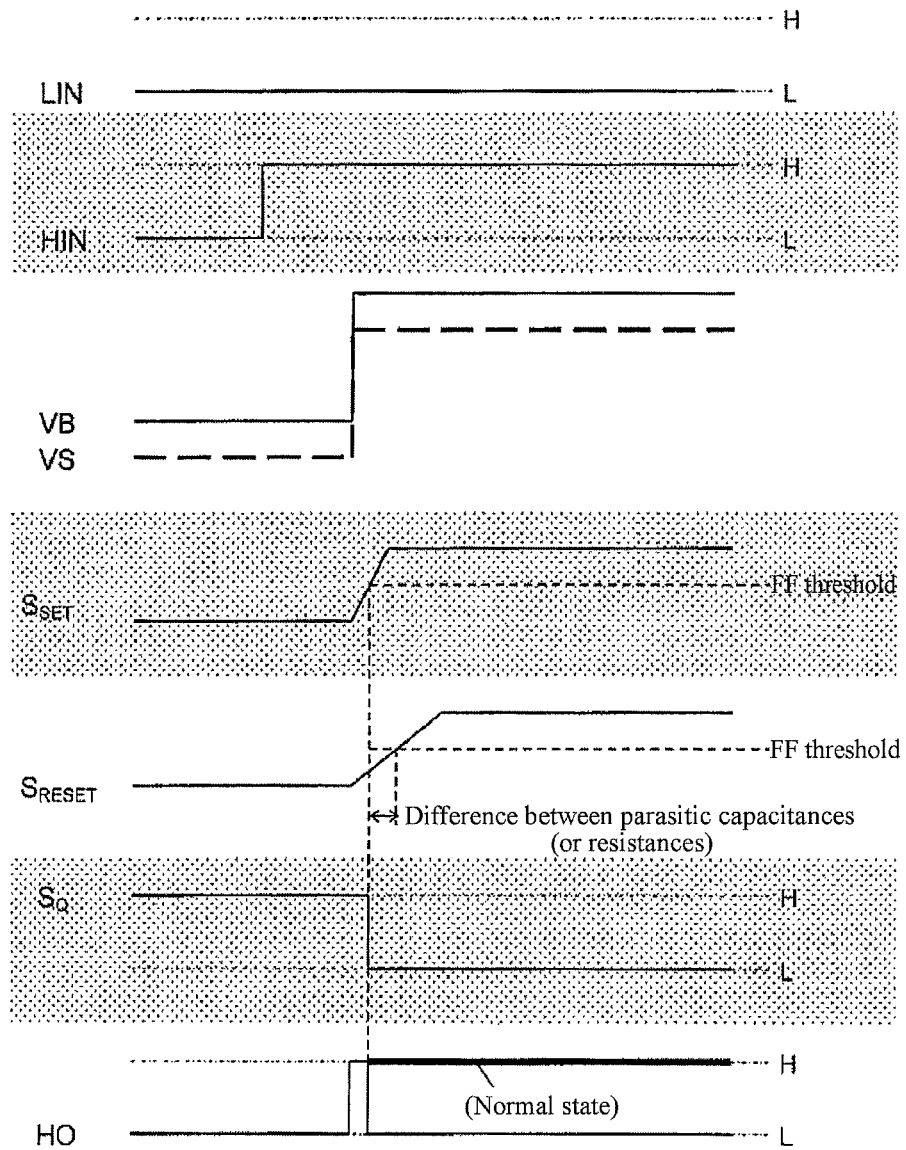
FIG. 8 is an explanatory diagram of a generating manner of an erroneous signal of an upper side output signal.

FIG. 8 is a timing chart exemplifying that when the upper side switch driving portion 10 is ON, high dVS/dt (>0) voltage change is generated. As shown in this drawing, if the voltage VB is rapidly generated as the voltage VS is changed, a rising delay occurs in the set signal $S_{SET}$ and the reset signal $S_{RESET}$ since the parasitic capacitances of the transistors 141 and 142 are charged. The extent of the delay varies depending on the difference between the parasitic capacitances. Moreover, since the resistors 143 and 144 are not always uniform, their rising delays differ in extent.

Due to such a difference between delay extent, deviation in timing is generated between the set signal $S_{SET}$ reaching an FF threshold (a voltage threshold for which the RS flip-flop circuit 12 distinguishes the signal change) and the reset signal $S_{RESET}$ reaching the FF threshold. As shown in FIG. 8, if the set signal $S_{SET}$ reaches the FF threshold, as shown by the bold line in FIG. 8, the upper side output signal HO, which should normally be maintained at a high level, is reduced to a low level. In this way, an erroneous signal of the upper side output signal HO is generated.

Figure 9:
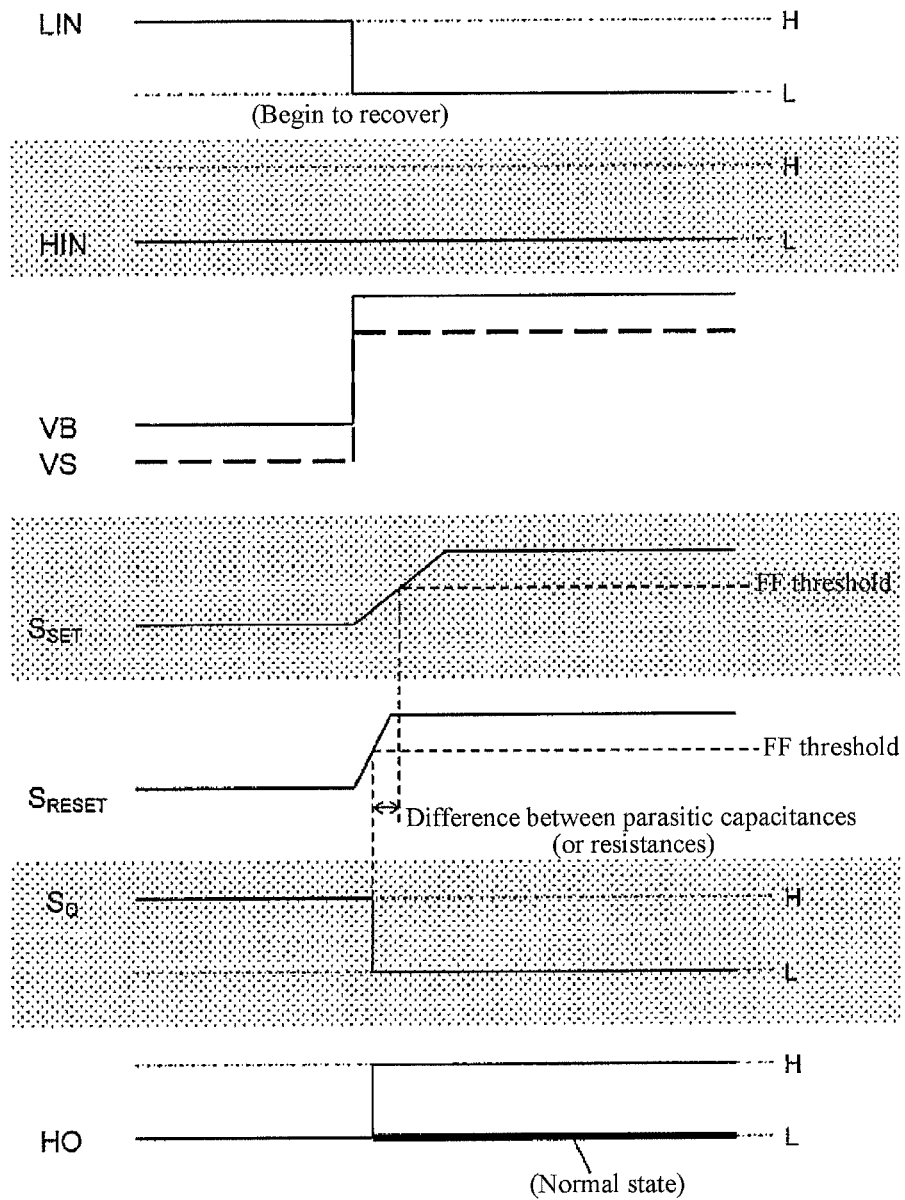
FIG. 9 is an explanatory diagram of a generating manner of an erroneous signal of an upper side output signal.

FIG. 9 is a timing chart exemplifying that when the upper side switch driving portion 10 is recovered, high dVS/dt (>0)

voltage change is generated. As shown in this drawing, if the voltage VB is rapidly generated as the voltage VS is changed, which is the same as the case of FIG. 8, deviation in timing is generated between the set signal $S_{SET}$ reaching the FF threshold and the reset signal $S_{RESET}$ reaching the FF threshold.

As shown in FIG. 9, if the reset signal $S_{RESET}$ reaches the FF threshold, as shown by the bold line in FIG. 9, the upper side output signal HO, which should normally be maintained at a low level, is raised to a high level. In this way, an erroneous signal of the upper side output signal HO is generated. Furthermore, after the upper side output signal HO is raised to a high level, if the lower side input signal LIN is raised to a high level, the device can become damaged due to short circuit of an upper arm and a lower arm.

Figure 10:
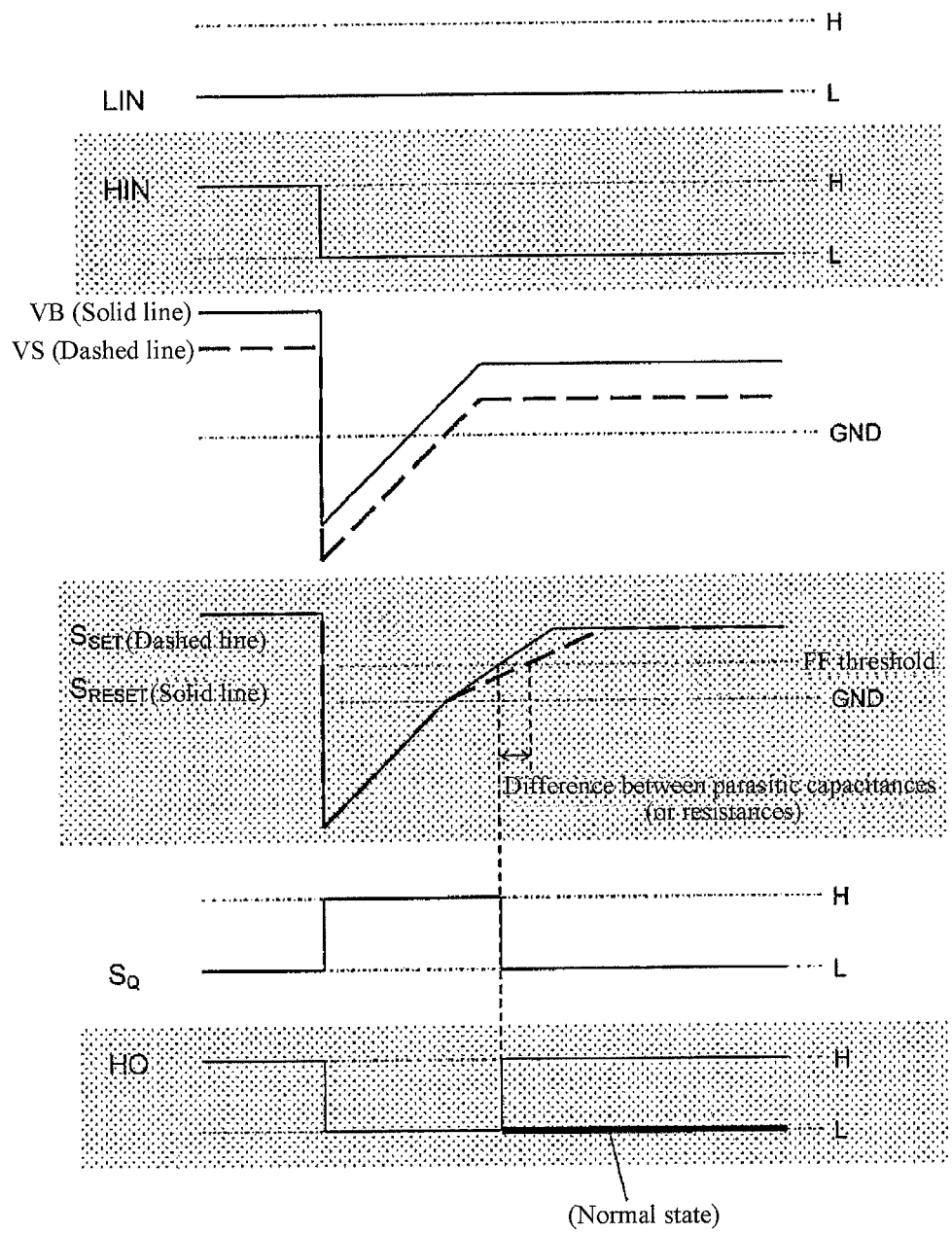
FIG. 10 is an explanatory diagram of a generating manner of an erroneous signal of an upper side output signal.

FIG. 10 is a timing chart exemplifying generation of dVS/dt (<0) voltage change (with particular attention to a difference between parasitic capacitances). As shown in this drawing, if the voltage VB is rapidly changed and descends to a negative potential as the voltage VS is changed, diodes of the transistors 141 and 142 are subjected to a forward bias, to generate a recovery current (reverse current) from the ground terminal GND.

In this case, the rising of the set signal $S_{SET}$ and the reset signal $S_{RESET}$ is delayed since parasitic capacitances of the transistors 141 and 142 are charged. The extent of the delay varies due to the difference between the parasitic capacitances. Moreover, since the resistors 143 and 144 are not uniform, they can differ in extent of rising delay.

Due to such a difference between extents of delay, deviation is generated between the timing when the set signal $S_{SET}$ reaches the FF threshold and the timing when the reset signal $S_{RESET}$ reaches the FF threshold. As shown in FIG. 10, if the reset signal $S_{RESET}$ reaches the FF threshold, as shown by the bold line in FIG. 10, the upper side output signal HO, which should normally be maintained at a low level, is raised to a high level. In this way, an erroneous signal of the upper side output signal HO is generated.

Figure 11:
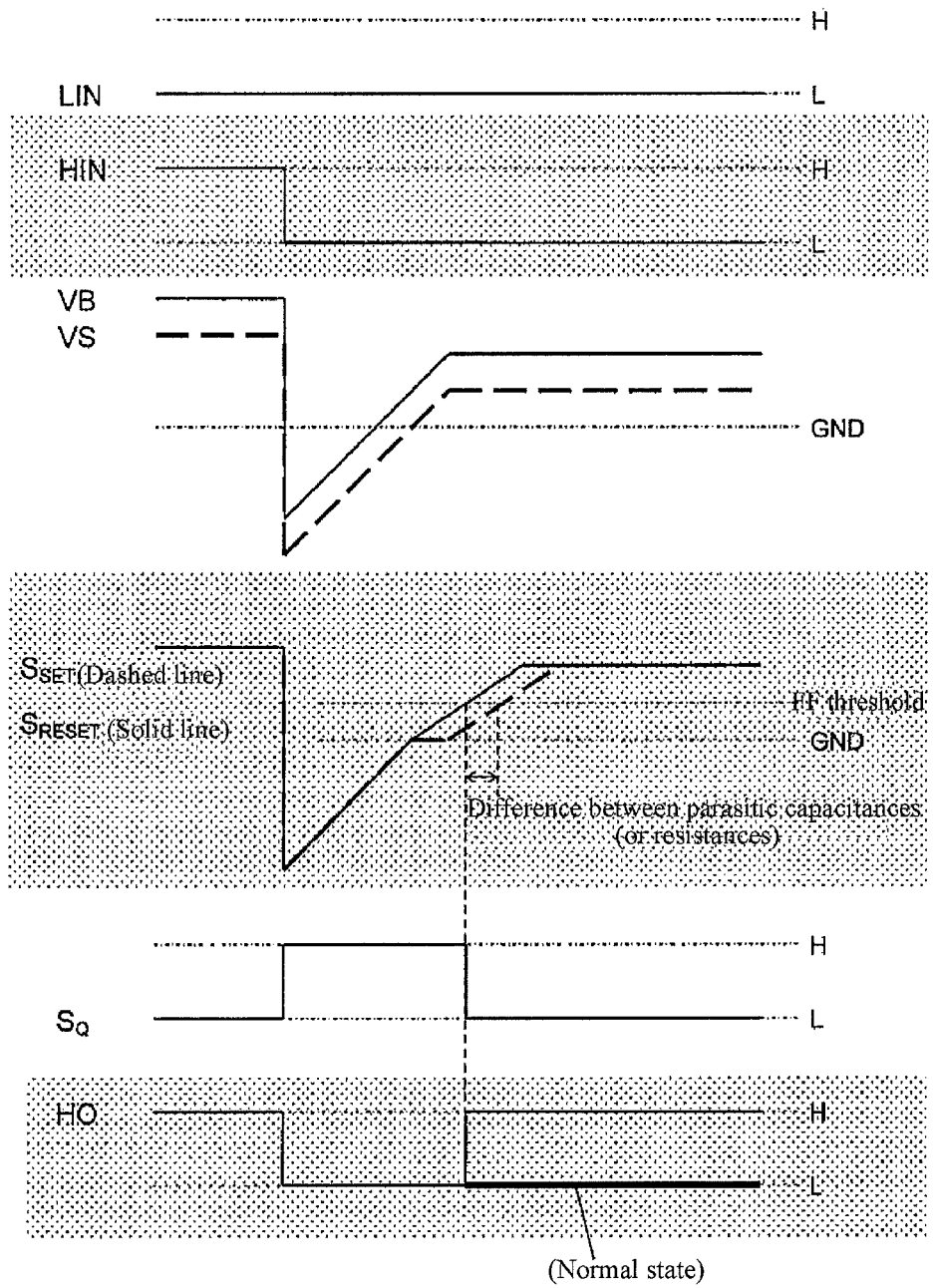
FIG. 11 is an explanatory diagram of a generating manner of an erroneous signal of an upper side output signal.

FIG. 11 is a timing chart exemplifying generation of dVS/dt (<0) voltage change (with particular attention to the influence of a parasitic diode). As shown in this drawing, if the voltage VB is rapidly changed and descends to a negative potential as the voltage VS is changed, diodes of the transistors 141 and 142 are subjected to a forward bias, to generate a recovery current (reverse current) from the ground terminal GND.

In this case, the rising of the set signal $S_{SET}$ and the reset signal $S_{RESET}$ is delayed since parasitic capacitances of the transistors 141 and 142 are charged. Herein, even if two parasitic capacitances are equal, since the recovery current flows into the transistor 141, the extent of rising delay varies due to the influence of the parasitic diode. Therefore, in the same manner as represented in FIG. 11, an erroneous signal of the upper side output signal HO is generated.

The switch driving device 1 disposed with the filtering circuit 13 according to the second embodiment can avoid generation of an erroneous signal of the upper side output signal HO caused in any one of the above-described manners. Moreover, even if the filtering circuit 13 is omitted in the switch driving device 1 according to the first embodiment, generation of an erroneous signal of the upper side output signal HO caused by the reverse current (recovery current) manner can be avoided.

Furthermore, rapid change of the voltage VS is more easily generated as the arm output of the switch driving device is switched at a high speed. Therefore, it is conventional to reduce switching speed in order to inhibit signal error. However, this produces disadvantages such as increase in switching loss and decrease in efficiency of an inverter. To address this issue, the switch driving device 1 according to this embodiment includes a mechanism to prevent generation of an erroneous signal so that high speed switching of the arm output can be performed, so as to improve the efficiency of the inverter.

<Application Example of Switch Driving Device>

Figure 12:
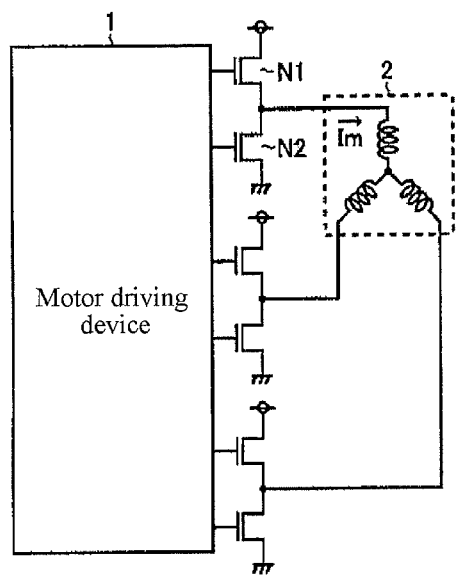
FIG. 12 is an explanatory diagram of an application example of a switch driving device according to each embodiment.

An application example of the switch driving device 1 is also illustrated. FIG. 12 is a diagram denoting a first application example of the switch driving device 1. As shown in FIG. 12, the switch driving device 1 can be applied as a motor driving device for driving the transistors N1 and N2, and controlling the driving current Im of a motor 2 (such as a compressor motor or fan motor for a white household appliance). Furthermore, FIG. 12 exemplifies a three-phase alternating current motor used as the motor 2, but the driven object of the switch driving device 1 is not limited thereto, and can alternatively be a two-phase alternating current motor or direct current motor.

Figure 13:
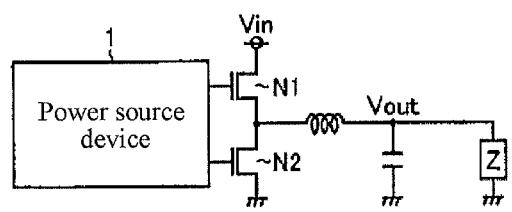
FIG. 13 is an explanatory diagram of an application example of a switch driving device according to each embodiment.

FIG. 13 is a diagram denoting a second application example of the switch driving device 1. As shown in FIG. 13, the switch driving device 1 can also be applied as a synchronous rectifying-type switching power source device for driving the transistors N1 and N2 complementarily (exclusively), and generating a desired output voltage Vout from the input voltage Vin. Furthermore, the term "complementarily (exclusively)" not only includes a case where on/off of the transistors N1 and N2 are completely reverse, but also includes a case where the transistors N1 and N2 are set to be simultaneously switched off in consideration of preventing a through current.

Figure 14:
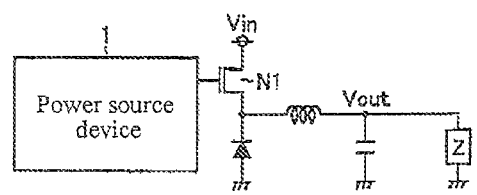
FIG. 14 is an explanatory diagram of an application example of a switch driving device according to each embodiment.
Figure 15:
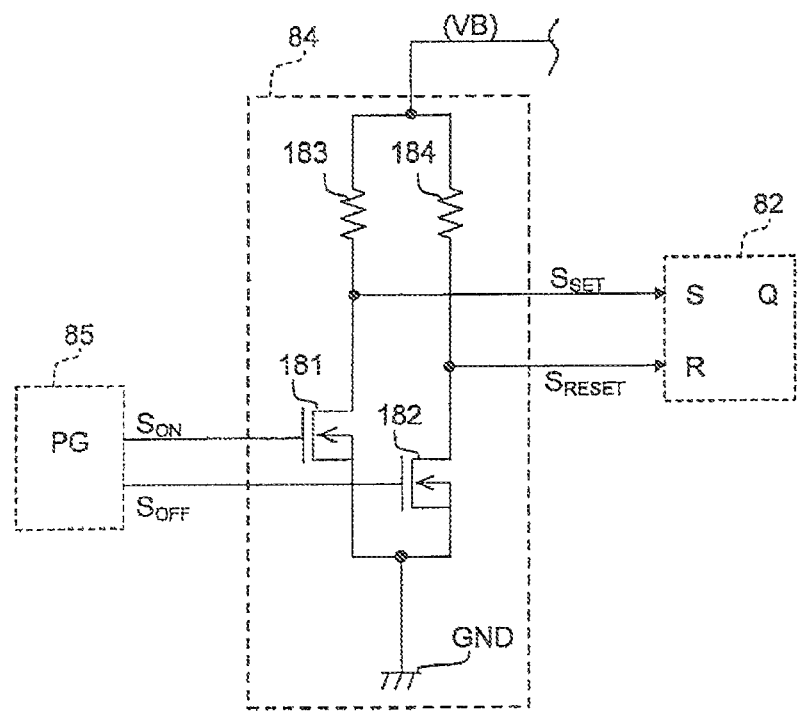
FIG. 15 is an explanatory diagram of a conventional signal transmission circuit.

FIG. 14 is a diagram denoting a third application example of the switch driving device 1. As shown in FIG. 14, the switch driving device 1 can also be applied as an asynchronous rectifying-type switching power source device for driving the transistor N1, and generating a desired output voltage Vout from the input voltage Vin.

The present invention can be preferably applied to, for example, motor drivers for white household appliances.

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

What is claimed is:

1. A signal transmission circuit, comprising a level shifting circuit for individually performing level shifting on a first input signal and a second input signal, and outputting the shifted results as a first shifted signal and a second shifted signal respectively, wherein:

the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and a voltage on the first series circuit is used as the first shifted signal, a voltage on the second series circuit is used as the second shifted signal, and the first shifted signal and the second shifted signal are separately output; and the level shifting circuit further comprises a counter-current preventing portion for preventing a reverse current from flowing from the ground terminal toward the first series circuit and the second series circuit.

2. The signal transmission circuit according to claim 1, wherein the counter-current preventing portion is a diode disposed between the ground terminal and the first series circuit and second series circuit.

3. The signal transmission circuit according to claim 2, further comprising an RS flip-flop circuit to which the first shifted signal and the second shifted signal used as a set signal and a reset signal respectively are input.

4. A switch driving device, comprising:
a signal transmission circuit comprising a level shifting circuit for individually performing level shifting on a first input signal and a second input signal, and outputting the shifted results as a first shifted signal and a second shifted signal respectively, wherein:
the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and
a voltage on the first series circuit is used as the first shifted signal, a voltage on the second series circuit is used as the second shifted signal, and the first shifted signal and the second shifted signal are separately output;
the level shifting circuit further comprises a counter-current preventing portion for preventing a reverse current from flowing from the ground terminal toward the first series circuit and the second series circuit, wherein the counter-current preventing portion is a diode disposed between the ground terminal and the first series circuit and second series circuit;
an RS flip-flop circuit to which the first shifted signal and the second shifted signal used as a set signal and a reset signal respectively are input; and
a driver, for generating an output signal corresponding to an output of the RS flip-flop circuit, and supplying the output signal to a switch.

5. The switch driving device according to claim 4, wherein the switch is driven, and a current of a motor is controlled.

6. The switch driving device according to claim 4, wherein the switch is driven, and a desired output voltage is generated from an input voltage.

7. A signal transmission circuit, comprising:
a level shifting circuit, for performing level shifting on pulse signals of both a first input signal and a second input signal, wherein the shifted pulse signals are separately used as a first shifted signal and a second shifted signal; and
a filtering circuit, for implementing filtering processing on the first shifted signal and the second shifted signal, wherein
the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and
a voltage on the first series circuit is used as the first shifted signal, and a voltage on the second series circuit is used as the second shifted signal,
the filtering circuit implements pulse termination delay processing on the first shifted signal to generate a mask signal corresponding to the second shifted signal, and implements pulse termination delay processing on the second shifted signal, to generate a mask signal corresponding to the first shifted signal, and
during a pulse of the mask signal, filtering processing is performed by proceeding pulse elimination processing on the first shifted signal and the second shifted signal.

8. The signal transmission circuit according to claim 7, further comprising an RS flip-flop circuit to which the first shifted signal and the second shifted signal used as a set signal and a reset signal respectively are input, wherein the filtering processing is implemented on the first shifted signal and the second shifted signal.

9. A switch driving device, comprising:
a signal transmission circuit comprising;
a level shifting circuit, for performing level shifting on pulse signals of both a first input signal and a second input signal, wherein the shifted pulse signals are separately used as a first shifted signal and a second shifted signal;
a filtering circuit, for implementing filtering processing on the first shifted signal and the second shifted signal, wherein
the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and
a voltage on the first series circuit is used as the first shifted signal, and a voltage on the second series circuit is used as the second shifted signal,
the filtering circuit implements pulse termination delay processing on the first shifted signal to generate a mask signal corresponding to the second shifted signal, and implements pulse termination delay processing on the second shifted signal, to generate a mask signal corresponding to the first shifted signal, and
during a pulse of the mask signal, filtering processing is performed by proceeding pulse elimination processing on the first shifted signal and the second shifted signal;
an RS flip-flop circuit to which the first shifted signal and the second shifted signal used as a set signal and a reset signal respectively are input, wherein the filtering processing is implemented on the first shifted signal and the second shifted signal; and
a driver, for generating an output signal corresponding to an output of the RS flip-flop circuit, and supplying the output signal to a switch.

10. The switch driving device according to claim 9, wherein the switch is driven, and a current of a motor is controlled.

11. The switch driving device according to claim 9, wherein the switch is driven, and a desired output voltage is generated from an input voltage.

12. A signal transmission circuit, comprising:
a level shifting circuit, for performing level shifting on pulse signals of both a first input signal and a second input signal, wherein the shifted pulse signals are separately used as a first shifted signal and a second shifted signal; and
a filtering circuit, for implementing filtering processing on the first shifted signal and the second shifted signal, wherein
the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and
a voltage on the first series circuit is used as the first shifted signal, and a voltage on the second series circuit is used as the second shifted signal,
the filtering circuit generates a mask signal corresponding to the second shifted signal based on the first shifted signal, and generates a mask signal corresponding to the first shifted signal based on the second shifted signal, and
after pulse onset delay processing is implemented on the first shifted signal and the second shifted signal, filtering processing is performed by proceeding pulse elimination processing on the first shifted signal and the second shifted signal during a pulse of the mask signal.

13. The signal transmission circuit according to claim 12, wherein the filtering circuit generates the mask signal corresponding to the second shifted signal by implementing pulse termination delay processing on the first shifted signal, and generates the mask signal corresponding to the first shifted signal by implementing pulse termination delay processing on the second shifted signal.

14. The signal transmission circuit according to claim 12, further comprising an RS flip-flop circuit to which the first shifted signal and the second shifted signal used as a set signal and a reset signal respectively are input, wherein the filtering processing is implemented on the first shifted signal and the second shifted signal.

15. The signal transmission circuit according to claim 13, further comprising an RS flip-flop circuit to which the first shifted signal and the second shifted signal used as a set signal and a reset signal respectively are input, wherein the filtering processing is implemented on the first shifted signal and the second shifted signal.

16. A switch driving device, comprising:
a signal transmission circuit comprising:
a level shifting circuit, for performing level shifting on pulse signals of both a first input signal and a second input signal, wherein the shifted pulse signals are separately used as a first shifted signal and a second shifted signal;
a filtering circuit, for implementing filtering processing on the first shifted signal and the second shifted signal, wherein
the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and
a voltage on the first series circuit is used as the first shifted signal, and a voltage on the second series circuit is used as the second shifted signal,
the filtering circuit generates a mask signal corresponding to the second shifted signal based on the first shifted signal, and generates a mask signal corresponding to the first shifted signal based on the second shifted signal, and
after pulse onset delay processing is implemented on the first shifted signal and the second shifted signal, filtering processing is performed by proceeding pulse elimination processing on the first shifted signal and the second shifted signal during a pulse of the mask signal;
an RS flip-flop circuit to which the first shifted signal and the second shifted signal used as a set signal and a reset signal respectively are input, wherein the filtering processing is implemented on the first shifted signal and the second shifted signal; and
a driver, for generating an output signal corresponding to an output of the RS flip-flop circuit, and supplying the output signal to a switch.

17. The switch driving device according to claim 16, wherein the switch is driven, and a current of a motor is controlled.

18. The switch driving device according to claim 16, wherein the switch is driven, and a desired output voltage is generated from an input voltage.

19. A switch driving device, comprising:
a signal transmission circuit comprising:
a level shifting circuit, for performing level shifting on pulse signals of both a first input signal and a second input signal, wherein the shifted pulse signals are separately used as a first shifted signal and a second shifted signal;
a filtering circuit, for implementing filtering processing on the first shifted signal and the second shifted signal, wherein
the level shifting circuit is provided between a power source and a ground terminal with a first series circuit having a first switching element switched according to the first input signal and a resistor connected to the first switching element in series, and a second series circuit having a second switching element switched according to the second input signal and a resistor connected to the second switching element in series, and the first series circuit and the second series circuit are connected in parallel, and
a voltage on the first series circuit is used as the first shifted signal, and a voltage on the second series circuit is used as the second shifted signal,
the filtering circuit generates a mask signal corresponding to the second shifted signal based on the first shifted signal, and generates a mask signal corresponding to the first shifted signal based on the second shifted signal, wherein the filtering circuit generates the mask signal corresponding to the second shifted signal by implementing pulse termination delay processing on the first shifted signal, and generates the mask signal corresponding to the first shifted signal by implementing pulse termination delay processing on the second shifted signal, after pulse onset delay processing is implemented on the first shifted signal and the second shifted signal, filtering processing is performed by proceeding pulse elimination processing on the first shifted signal and the second shifted signal during a pulse of the mask signal;

an RS flip-flop circuit to which the first shifted signal and the second shifted signal used as a set signal and a reset signal respectively are input, wherein the filtering processing is implemented on the first shifted signal and the second shifted signal; and a driver, for generating an output signal corresponding to an output of the RS flip-flop circuit, and supplying the output signal to a switch.

20. The switch driving device according to claim 19, wherein the switch is driven, and a current of a motor is controlled.

21. The switch driving device according to claim 19, wherein the switch is driven, and a desired output voltage is generated from an input voltage.

* * * * *